(12) United States Patent
Chen et al.

(10) Patent No.: US 11,015,789 B2
(45) Date of Patent: May 25, 2021

(54) WIRING BOX FOR LIGHTING APPARATUS

(71) Applicant: XIAMEN ECO LIGHTING CO. LTD., Xiamen (CN)

(72) Inventors: Chunteng Chen, Xiamen (CN); Xiaobin Chen, Xiamen (CN)

(73) Assignee: XIAMEN ECO LIGHTING CO. LTD., Xiamen (CN)

(*) Notice: Subject to any disclaimer, the term of this patent is extended or adjusted under 35 U.S.C. 154(b) by 0 days.

(21) Appl. No.: 16/860,016

(22) Filed: Apr. 27, 2020

(65) Prior Publication Data

US 2021/0048183 A1    Feb. 18, 2021

(51) Int. Cl.
| | |
|---|---|
| H02G 3/14 | (2006.01) |
| F21V 23/00 | (2015.01) |
| H02G 3/08 | (2006.01) |
| H02G 3/03 | (2006.01) |
| F21V 29/70 | (2015.01) |
| F21V 23/04 | (2006.01) |

(52) U.S. Cl.
CPC .......... *F21V 23/001* (2013.01); *F21V 23/003* (2013.01); *F21V 23/04* (2013.01); *F21V 29/70* (2015.01); *H02G 3/03* (2013.01); *H02G 3/083* (2013.01); *H02G 3/086* (2013.01); *H02G 3/14* (2013.01)

(58) Field of Classification Search
CPC ....................................................... H02G 3/14
See application file for complete search history.

(56) References Cited

U.S. PATENT DOCUMENTS

| | | | | |
|---|---|---|---|---|
| 8,410,363 | B1* | 4/2013 | Baldwin | H02G 3/14 |
| | | | | 174/67 |
| 9,800,036 | B1* | 10/2017 | Baldwin | H01R 24/70 |
| 2016/0261101 | A1* | 9/2016 | Hopper | H02G 3/18 |
| 2017/0244231 | A1* | 8/2017 | Hemingway | H02G 3/081 |

* cited by examiner

*Primary Examiner* — Hung V Ngo
(74) *Attorney, Agent, or Firm* — Chun-Ming Shih; Lanway IPR Services

(57) ABSTRACT

A wiring box is used for connecting an external wire to a driver circuit and for connecting the driver circuit to a lighting apparatus. The wiring box includes a box container and a foldable top cover. In some embodiments, it is preferable that the lighting apparatus have elongated shapes, like light tubes. The box container has a box opening. The foldable top cover includes a center plate and at least one lateral plate. The center plate is connected to the at least one lateral plate with an axial structure, the lateral plate is folded to align with the center plate in an elongated manner during shipping. The lateral plate is rotated with respect to the center plate along the axial structure to expand and to cover the box opening of the box container.

19 Claims, 17 Drawing Sheets

WIRING BOX FOR LIGHTING APPARATUS

FIELD

The present application is related to a wiring box and more particularly related to a wiring box connected to a lighting apparatus.

BACKGROUND

Electroluminescence, an optical and electrical phenomenon, was discover in 1907. Electroluminescence refers the process when a material emits light when a passage of an electric field or current occurs. LED stands for light-emitting diode. The very first LED was reported being created in 1927 by a Russian inventor. During decades' development, the first practical LED was found in 1961, and was issued patent by the U.S. patent office in 1962. In the second half of 1962, the first commercial LED product emitting low-intensity infrared light was introduced. The first visible-spectrum LED, which limited to red, was then developed in 1962.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

With high light output, LEDs are available across the visible, infrared wavelengths, and ultraviolet lighting fixtures. Recently, there is a high-output white light LED. And this kind of high-output white light LEDs are suitable for room and outdoor area lighting. Having led to new displays and sensors, LEDs are now be used in advertising, traffic signals, medical devices, camera flashes, lighted wallpaper, aviation lighting, horticultural grow lights, and automotive headlamps. Also, they are used in cellphones to show messages.

A Fluorescent lamp refers to a gas-discharge lamps. The invention of fluorescent lamps, which are also called fluorescent tubes, can be traced back to hundreds of years ago. Being invented by Thomas Edison in 1896, fluorescent lamps used calcium tungstate as the substance to fluoresce then. In 1939, they were firstly introduced to the market as commercial products with variety of types.

In a fluorescent lamp tube, there is a mix of mercury vapor, xenon, argon, and neon, or krypton. A fluorescent coating coats on the inner wall of the lamp. The fluorescent coating is made of blends of rare-earth phosphor and metallic salts. Normally, the electrodes of the lamp comprise coiled tungsten. The electrodes are also coated with strontium, calcium oxides and barium. An internal opaque reflector can be found in some fluorescent lamps. Normally, the shape of the light tubes is straight. Sometimes, the light tubes are made circle for special usages. Also, u-shaped tubes are seen to provide light for more compact areas.

Because there is mercury in fluorescent lamps, it is likely that the mercury contaminates the environment after the lamps are broken. Electromagnetic ballasts in fluorescent lamps are capable of producing buzzing mouse. Radio frequency interference is likely to be made by old fluorescent lamps. The operation of fluorescent lamps requires specific temperature, which is best around room temperature. If the lamps are placed in places with too low or high temperature, the efficacy of the lamps decreases.

In real lighting device design, details are critical no matter how small they appear. For example, to fix two components together conveniently usually brings large technical effect in the field of light device particularly when any such design involves a very large number of products to be sold around the world.

Some small components, like wiring boxes, may not appear important at first glance. However, it is helpful to identify problems not noticed and provide improvement to lighting apparatuses. Some may involve manufacturing cost, and some may involve shipping cost, stocking cost and convenience.

SUMMARY

In some embodiments, a wiring box is used for connecting an external wire to a driver circuit and for connecting the driver circuit to a lighting apparatus. The wiring box includes a box container and a foldable top cover. In some embodiments, it is preferable that the lighting apparatus have elongated shapes, like light tubes.

The box container has a box opening. The foldable top cover includes a center plate and at least one lateral plate. The center plate is connected to the at least one lateral plate with an axial structure, the lateral plate is folded to align with the center plate in an elongated manner during shipping. The lateral plate is rotated with respect to the center plate along the axial structure to expand and to cover the box opening of the box container.

In some embodiments, when the center plate and the at least one lateral plate cover the box opening, the center plate and the at least one lateral plate form a wire opening for the external wire to pass through.

In some embodiments, the wire opening has a friction tap for fastening a connection to the external wire by adding friction to the connection to the external wire.

In some embodiments, a first connector portion of the center plate is connected to a second connector portion of the lateral plate, a first main portion of the center plate has a first main surface and the first connector portion of the center plate has a first connector surface, the first main surface is parallel to the first connector surface but on different planes, a second main portion of the lateral plate has a second main surface, the second main surface and the first main surface are on the same plane.

In some embodiments, there is a first stop structure on the center plate to limit rotation of the lateral plate rotating with respect to the center plate.

In some embodiments, the first stop structure clips the lateral plate to keep the lateral plate staying at a rotation position with respect to the center plate unless an external force is larger than a threshold to change the rotation position.

In some embodiments, the lighting apparatus is a light tube.

In some embodiments, there is only one lateral plate located at one end of the center plate, and the box opening is a circular shape.

In some embodiments, there are two lateral plates located at two opposite ends of the center plate, and the box opening is a circular shape.

In some embodiments, there are two lateral plates located at two opposite ends of the center plate, the two lateral plates are triangle shapes and has a half size of the center plate, the box opening is a rectangular shape.

In some embodiments, there are two lateral plates located at two opposite ends of the center plate, the center plate and the two lateral plates are rhombus shapes and the box opening is a hexagonal shape.

In some embodiments, the box container is foldable to be a flatten piece.

In some embodiments, a rotation angle between the lateral plate and the center plate corresponds to a parameter for a driver to control the lighting apparatus.

In some embodiments, a manual switch is disposed on the center plate for a user to operate the manual switch for changing a parameter of a driver to control the lighting apparatus.

In some embodiments, the box container has a connector for connecting to anther box container of another wiring box.

In some embodiments, the container box has multiple tracks for installing multiple function modules.

In some embodiments, the container box has a conductive path for connecting the function modules installed in the tracks.

In some embodiments, the container box is made of metal material.

In some embodiments, a heat dissipation strip is extended from the lighting apparatus to the container box for carrying away heat from the lighting apparatus to the container box.

In some embodiments, the heat dissipation strip is electrically isolated from electrical connection of the lighting apparatus.

DETAILED DESCRIPTION

Embodiment One

Figure 1:
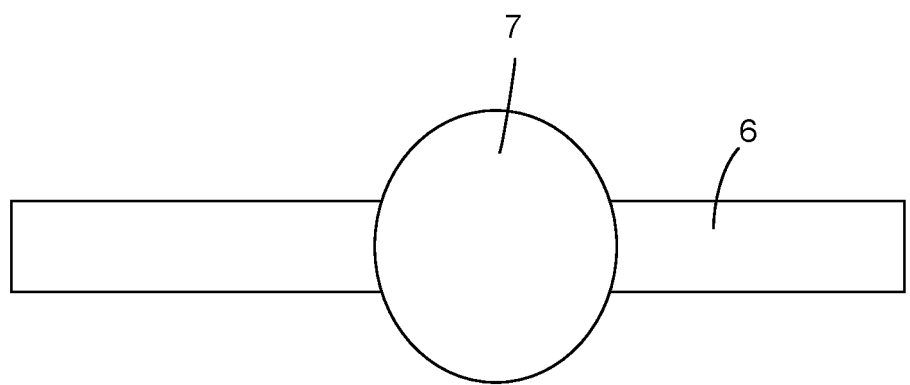
FIG. 1 illustrates an embodiment having a lighting apparatus and a wiring box.

Please refer to FIG. 1. A wiring box 7 pairs up with a corresponding lighting apparatus 6 with an elongated shape like a light tube. The wiring box 7 and the light body 6 are packed together. Because the wiring box 7 is taller than the light body 6, the package volume is large and is therefore inconvenient for transportation.

Figure 2:
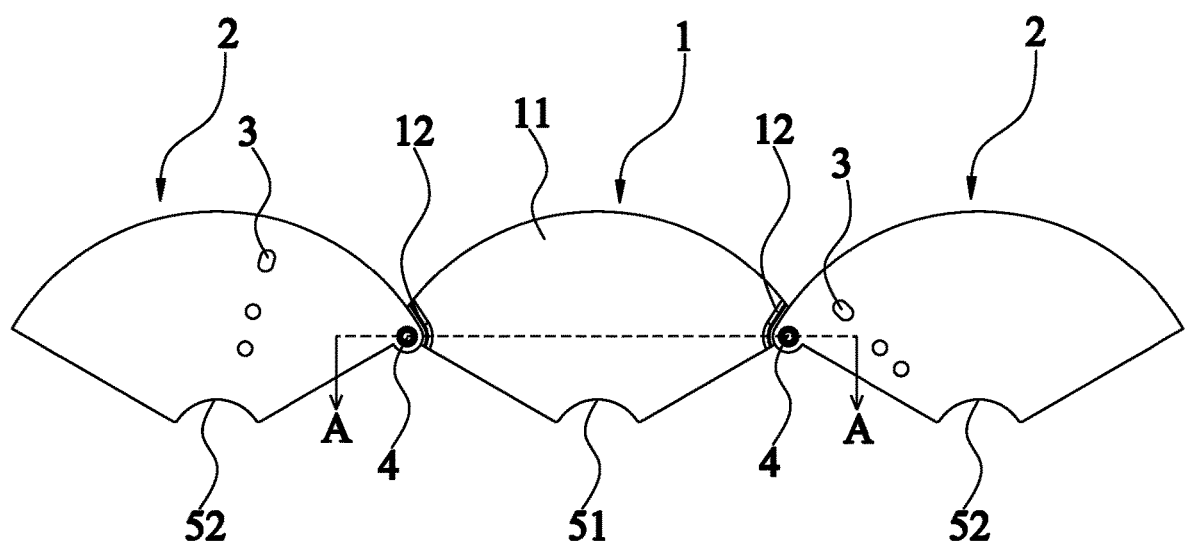
FIG. 2 illustrates a top cover example of a wiring box.
Figure 3:
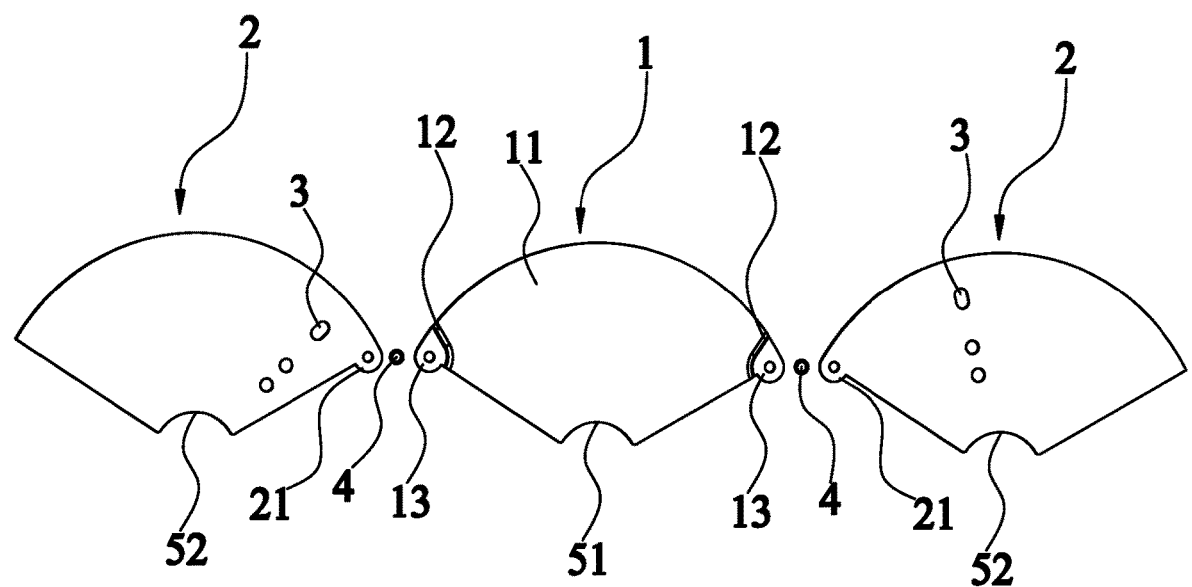
FIG. 3 illustrates another status of the example in FIG. 2.
Figure 4:
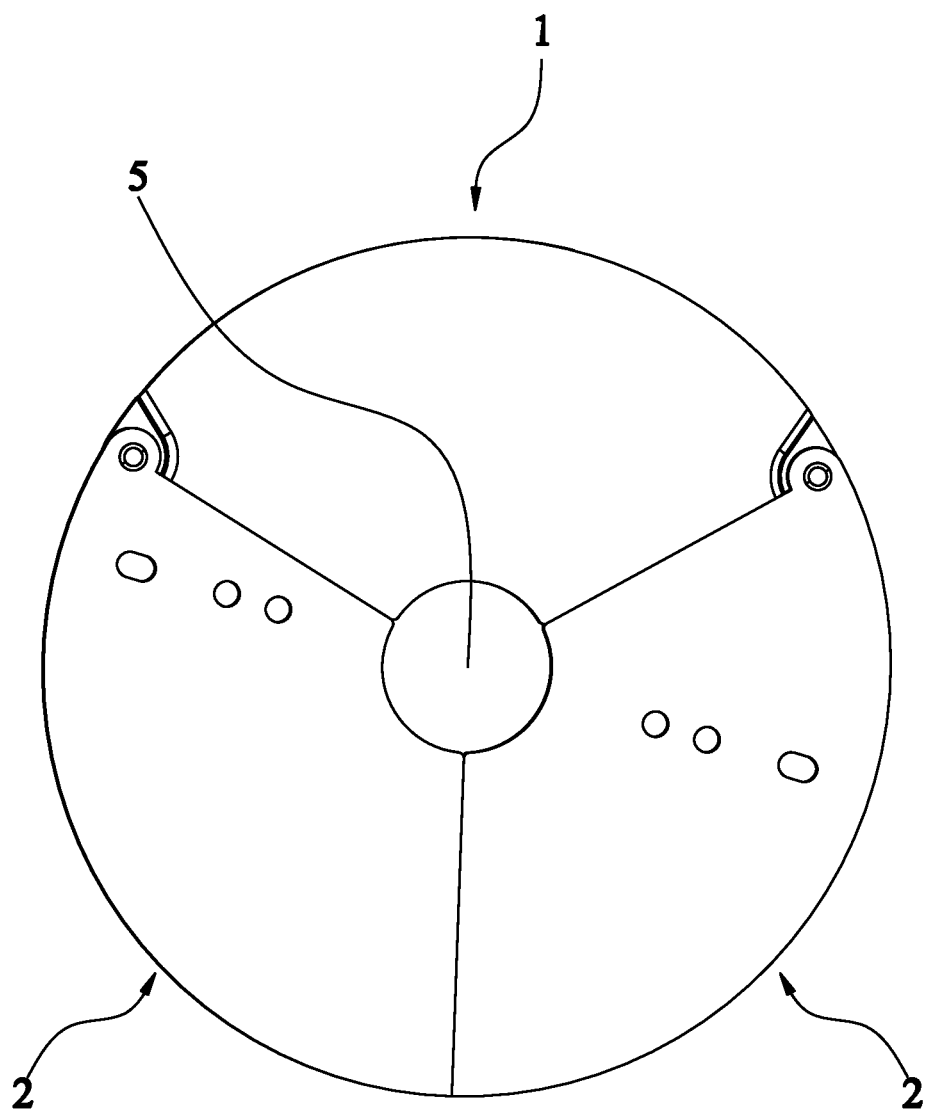
FIG. 4 illustrates another status of the example in FIG. 2.
Figure 5:
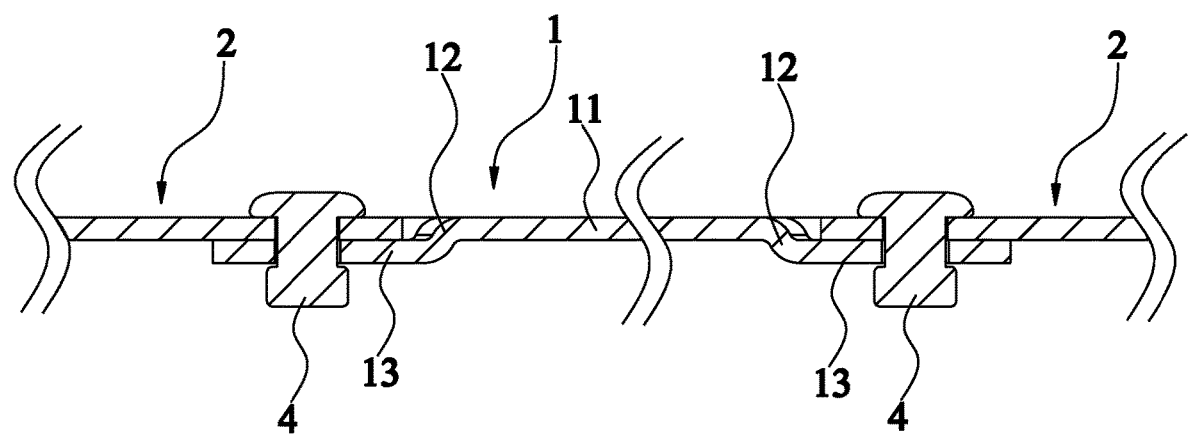
FIG. 5 illustrates a section view of a top cover example.

Please refer to FIG. 2 to FIG. 4 for an embodiment of the wiring box. The wiring box has a center plate 1 and a lateral plate 2. The lateral plate 2 is rotatably connected with at least one end of the center plate 1. Under operation, the center plate 1 and the lateral plate 2 are capable of being rotated forming a shield surface.

The shield surface is circular and is used for shielding the wire connecting box. Under package, the center plate 1 and the lateral plate 2 are capable of being set side-by-side.

In the embodiment, the center plate 1 and the lateral plate 2 are capable of rotating to form a line when the wiring box is packaged with the linear light body. Namely, the center plate 1 and the lateral plate 2 are capable of being set side-by-side.

Therefore, the height of the wiring box is reduced to make the shape of the wiring box to match to the shape of the light body. The original package height of the light body is capable of packaging the light body and the wiring box together, and further reducing the package volume and the transportation cost.

Please refer to FIG. 2 to FIG. 4 for an embodiment of the wiring box. Optionally, the quantity of the center plate 1 is one, and the quantity of the lateral plate 2 is two.

The two lateral plates 2 are respectively rotatably connected with the corresponding two ends of the center plate 1. Please refer to FIG. 2. The center plate 1 and the lateral plate 2 are capable of rotating to form a line when the wiring box needs to be packaged and transported. Please refer to FIG. 4.

Under the operation of the wire connecting box, the center plate 1 and the lateral plate 2 are capable of rotated forming a shield surface. The shield surface is used for shielding the wire connecting box. In the embodiment, the wiring box is capable of being covered and set on the wire connecting box.

Optionally, the quantity of the center plate 1 and the lateral plate 2 is adjustive. For example, the wiring box has a plurality of the first clocking board 1 and the lateral plate 2 set interlaced. The head and the end of the center plate 1 and the lateral plate 2 are rotatably connected, and the package volume and the transportation cost are reduced effectively.

More particularly, please refer to FIG. 2 to FIG. 5. The center plate 1 has a main body 11 and a concave portion 13. The concave portion 13 is connected with the corresponding two ends of the main body 11. The lateral plate 2 is rotated connected on the concave portion 13.

More particularly, a matching part 21 is set on the end of the lateral plate 2 corresponding to the concave portion 13. The matching part 21 is rotatably connected on the concave portion 13.

In the embodiment, the matching part 21 is capable of being riveted jointed on the corresponding concave portion 13 through rivet 4, and further enabling the matching part 21 and the concave portion 13 to be rotatably connected. Optionally, the matching part 21 is capable of being rotatably connected with the concave portion 13 through other connecting approaches, the embodiment does not limit here.

Further, to make easy for the center plate 1 and the lateral plate 2 to rotate to form a line, the center plate 1 has a stop structure 12. One end of the stop structure 12 connects with the end of the main body 11. The stop structure 12 is used for limiting the rotating angle of the lateral plate 2. The end of the stop structure 12 being away from the main body 11 connects with the concave portion 13.

The center plate 1 and the lateral plate 2 are capable of rotating to form a line rapidly, and further improving the package efficiency.

More particularly, when the center plate 1 and the lateral plate 2 are set side-by-side, at least one installation hole 3 is set on the blocking boards being on the corresponding sides of the wiring box.

The installation hole 3 passes through along the thickness direction of the wiring box. The installation hole 3 is installed on an installation surface such as the wire connecting box or a ceiling. Namely, under the package of the wiring box, the installation hole 3 is set on the blocking boards being on the corresponding sides of the wiring box.

The installation hole 3 passes through along the thickness direction of the wiring box and is installed on the installation surface. When the wiring box is installed on the installation surface, the neighboring blocking boards are not capable of rotating. Therefore, the stability of the wiring box is enhanced.

The blocking boards are the center plate 1 and/or the lateral plate 2, and the same in hereinafter description. Optionally, based on the basic installation mentioned above, the installation hole 3 is capable of being set on the other blocking boards being between the blocking boards being on the corresponding sides of the wiring box. Therefore, the stability of the wiring box is enhanced.

Please refer to FIG. 2 to FIG. 5 for an embodiment of the wiring box. Three installation hole 3 are spaced set on the lateral plate 2. The installation hole 3 is capable of being installed on the installation surface by a corresponding screw. Optionally, the quantity of the installation hole 3 being on the main body 11 is adjustive, the embodiment does not limit here.

Optionally, when the installation hole 3 is set on the main body 11, the installation hole 3 is capable of being circular or rectangular. When a plurality of the installation hole 3 is set on the main body 11, the installation hole 3 has to be at least one circular and one rectangular. The shape of the installation hole 3 is adjustive, the embodiment does not limit here.

Please refer to FIG. 4. The installation surface is formed by the center plate 1 and the lateral plate 2. A wire opening 5 is at the center of the installation surface. Wire passes through the wire opening 5. The wiring box is covered and set on the wire connecting box.

Therefore, the wire in the wire connecting box is capable of passing through the wire opening 5 to electrically connect with electric apparatus such as lighting apparatus, and further providing electric power to electric apparatus.

Optionally, the wire opening 5 is circular. An inner side is the side of the center plate 1 and the lateral plate 2 being near to the wire opening 5. A first arc edge 51 is set on the inner side of the center plate 1. A second arc edge 52 is set on the inner side of the lateral plate 2. The first arc edge 51 connects with the second arc edge 52 being on the two ends of the first arc edge 51, forming circular wire opening 5.

Optionally, the wire opening 5, the inner side of the center plate 1 and the inner side of the lateral plate 2 are adjustive, the embodiment does not limit the invention scopes.

More particularly, the wore connecting box cover is circular. Optionally, the shape of the wiring box is adjustive, the embodiment does not limit the invention scopes.

Ideally optionally, every installation hole 3 being on the blocking board is radially set on the same line, using the center of the wire opening 5 as a round center. Further, the stability of the wiring box is guaranteed.

Please refer to FIG. 2 to FIG. 5. Three installation hole 3 being on the lateral plate 2 are radially set on the same line, using the center of the wire opening 5 as a round center. In this embodiment, the wiring box has three one-third circular portions. Namely, the center plate 1 and the lateral plate 2 are one-third circular. Therefore, one center plate 1 and two lateral plate 2 are capable of forming a circular wiring box.

Embodiment Two

Figure 6:
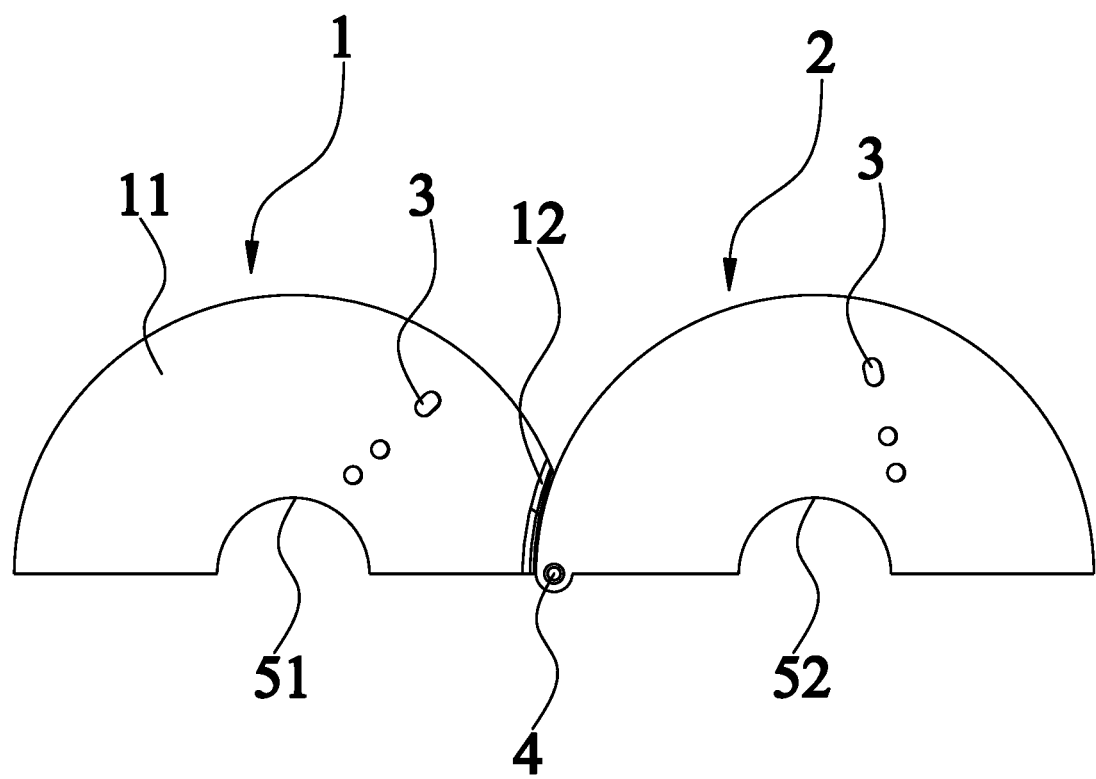
FIG. 6 illustrates another top cover embodiment.
Figure 7:
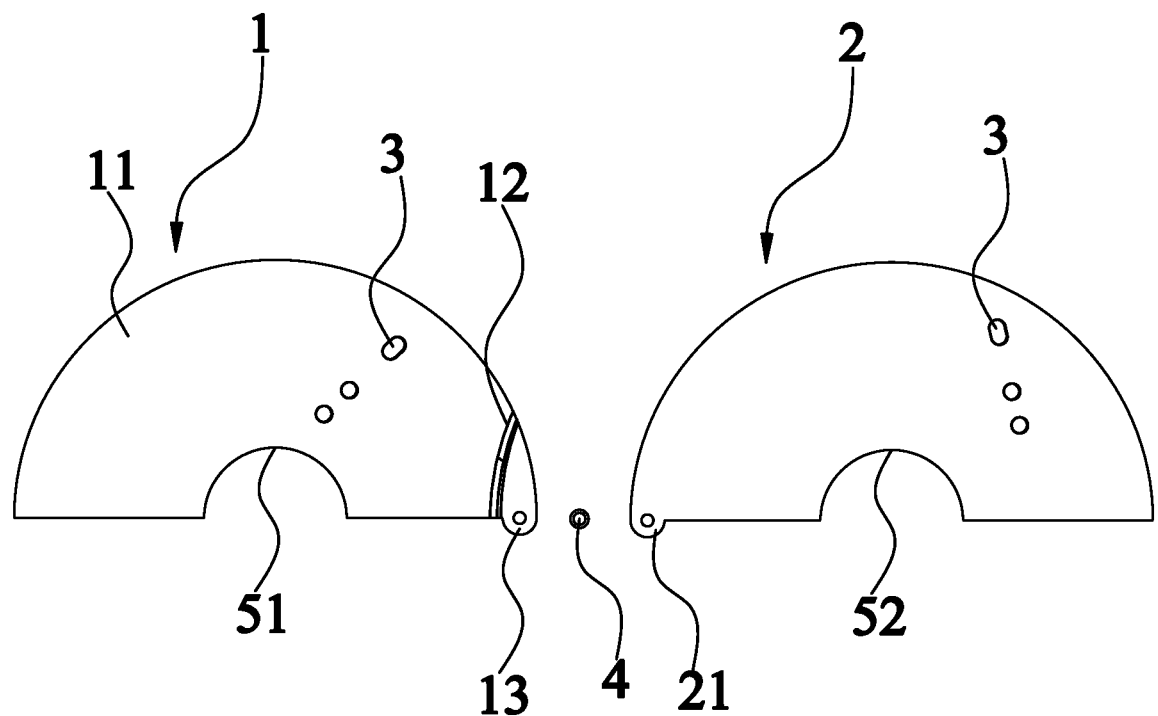
FIG. 7 illustrates another status of the example in FIG. 6.
Figure 8:
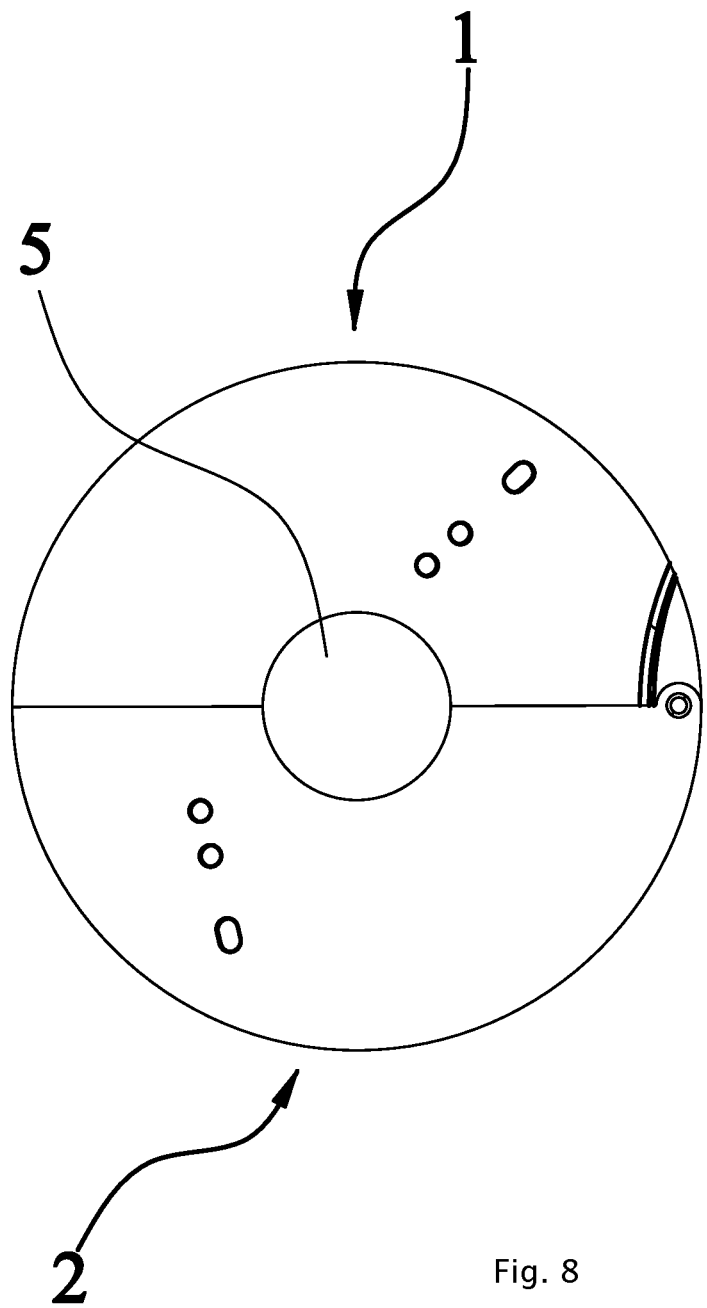
FIG. 8 illustrates another status of the example in FIG. 6.

Please refer to FIG. 6 to FIG. 8, a wiring box is provided. The quantity of the center plate 1 is one. The quantity of the lateral plate 2 is two. The lateral plate 2 is rotated connected with one end of the center plate 1. And the same effect is capable of being achieved.

More particularly, the installation hole 3 is set on both the main body 11 and the lateral plate 2. Therefore, the wiring box is capable of being installed on the installation surface stably.

In this embodiment, the wiring box has two semicircular portions. Namely, the center plate 1 and the lateral plate 2 are semicircular; therefore, one center plate 1 and one lateral plate 2 are capable of forming a circular wiring box.

Embodiment Three

Figure 9:
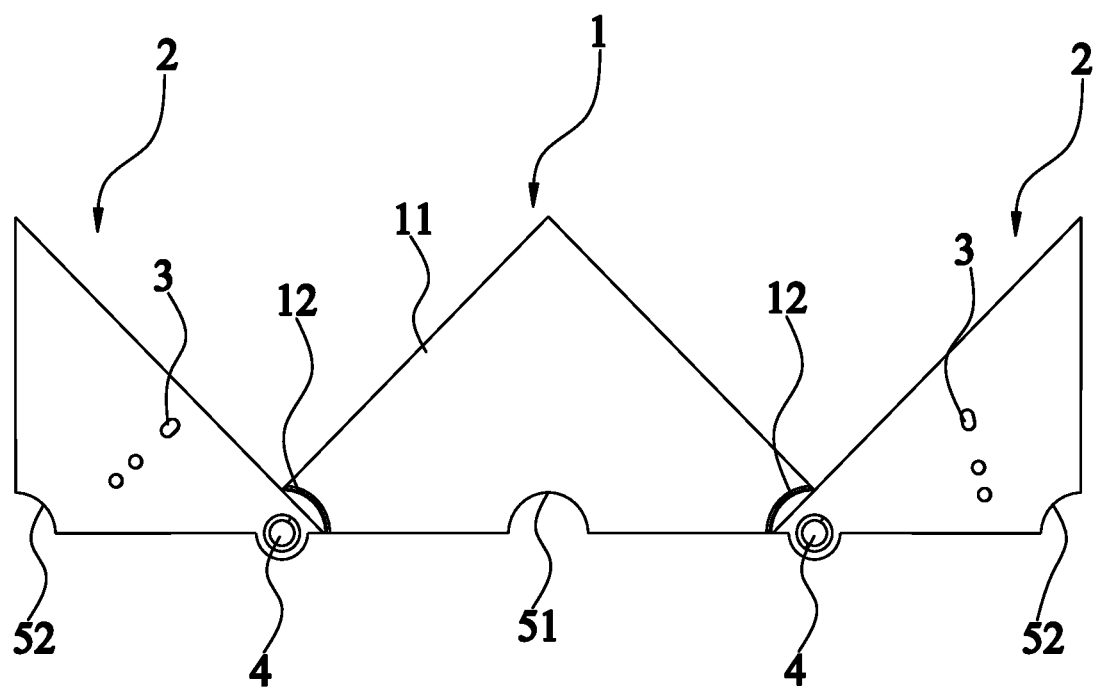
FIG. 9 illustrates another top cover embodiment.
Figure 10:
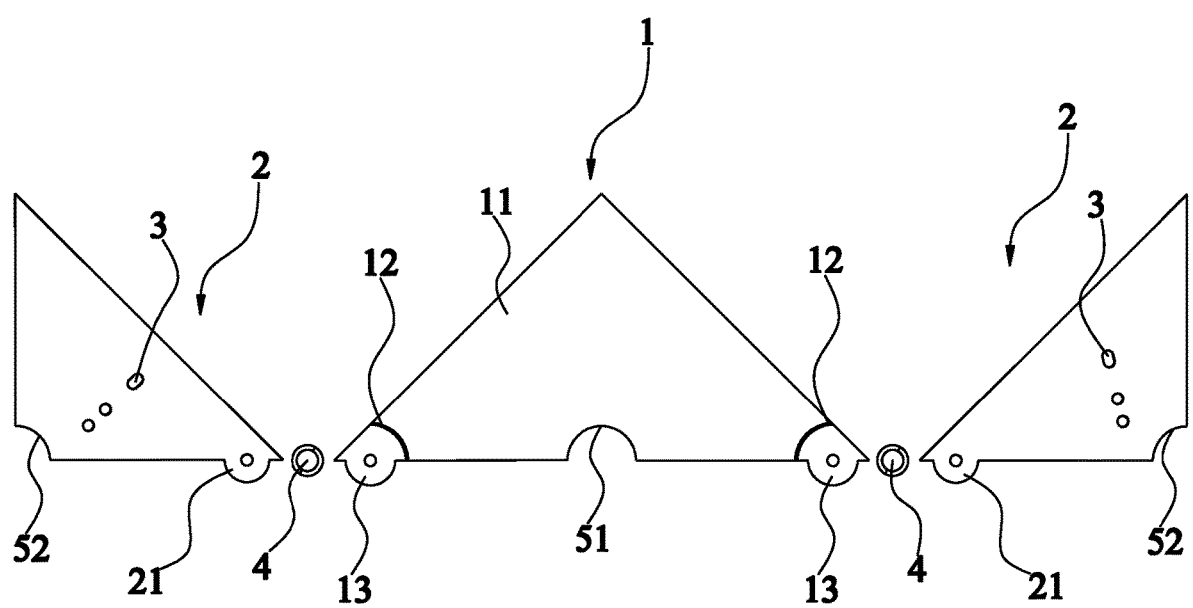
FIG. 10 illustrates another status of the example in FIG. 9.
Figure 11:
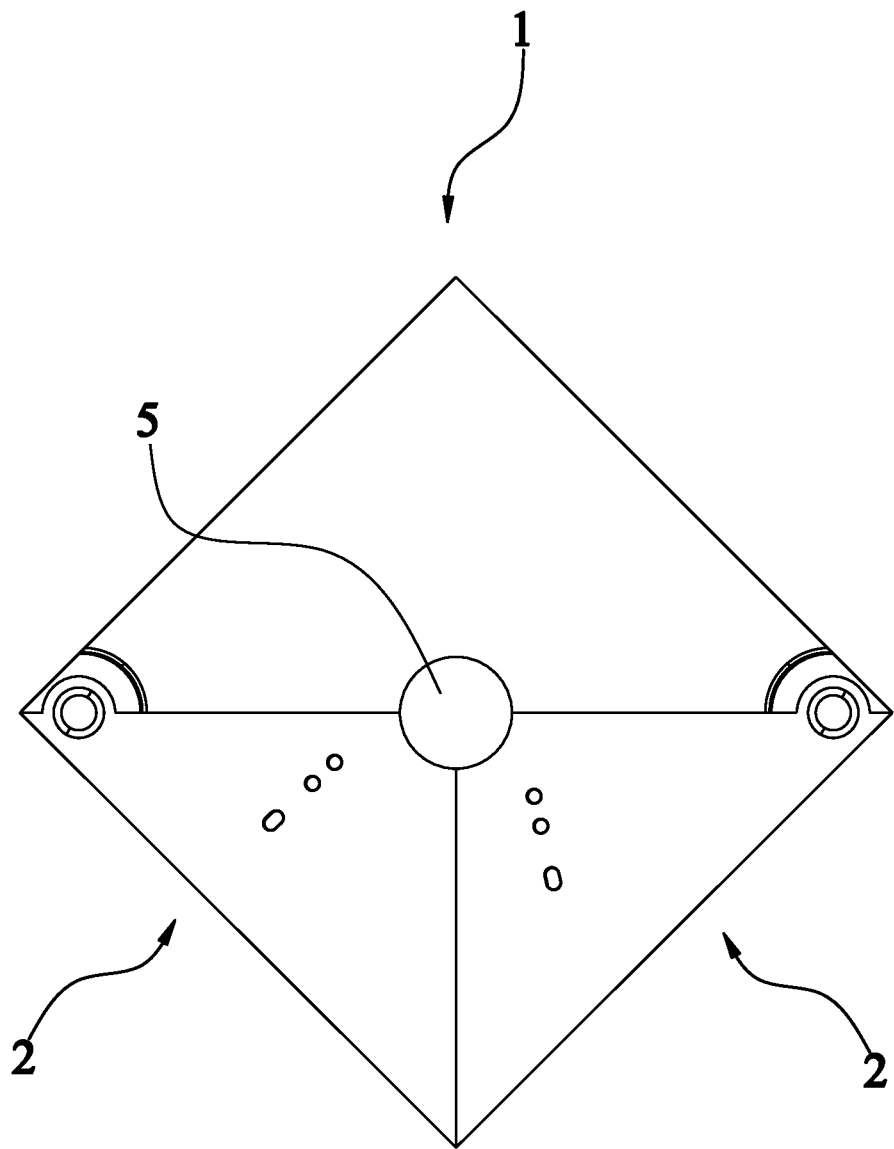
FIG. 11 illustrates another status of the example in FIG. 9.

Please refer to FIG. 9 to FIG. 11, a wiring box is provided. The wiring box is quadrangle. And the same effect is capable of being achieved.

In this embodiment, the wiring box has three triangle portions. Namely, the center plate 1 and the lateral plate 2 are triangle. Therefore, one center plate 1 and two lateral plate 2 are capable of forming a square wiring box. The size of the two lateral plate 2 combined matches to the size of the center plate 1.

Embodiment Four

Figure 12:
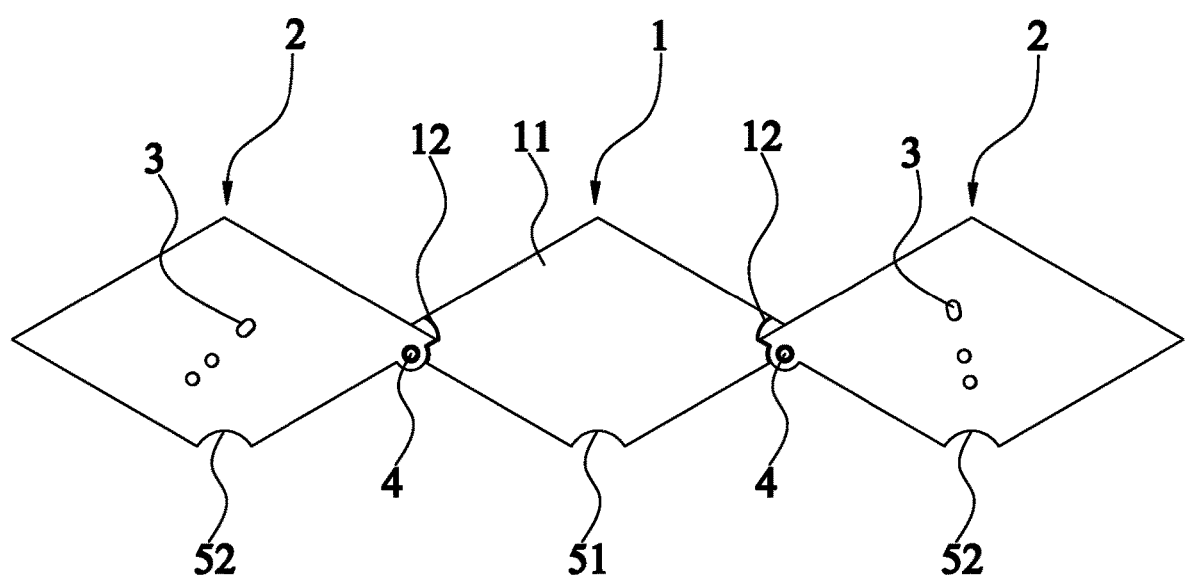
FIG. 12 illustrates another top cover embodiment.
Figure 13:
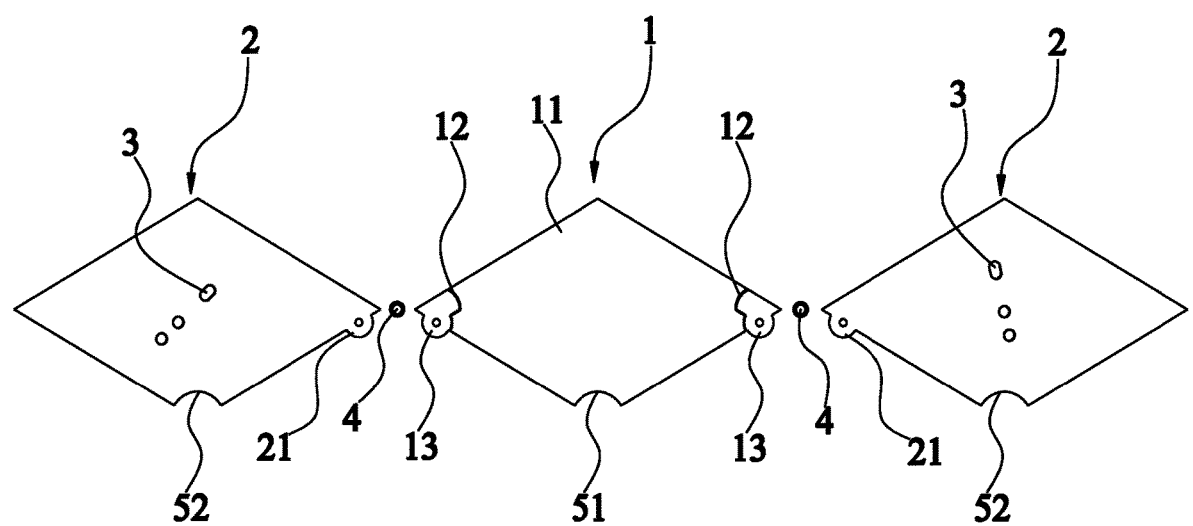
FIG. 13 illustrates another status of the example in FIG. 12.
Figure 14:
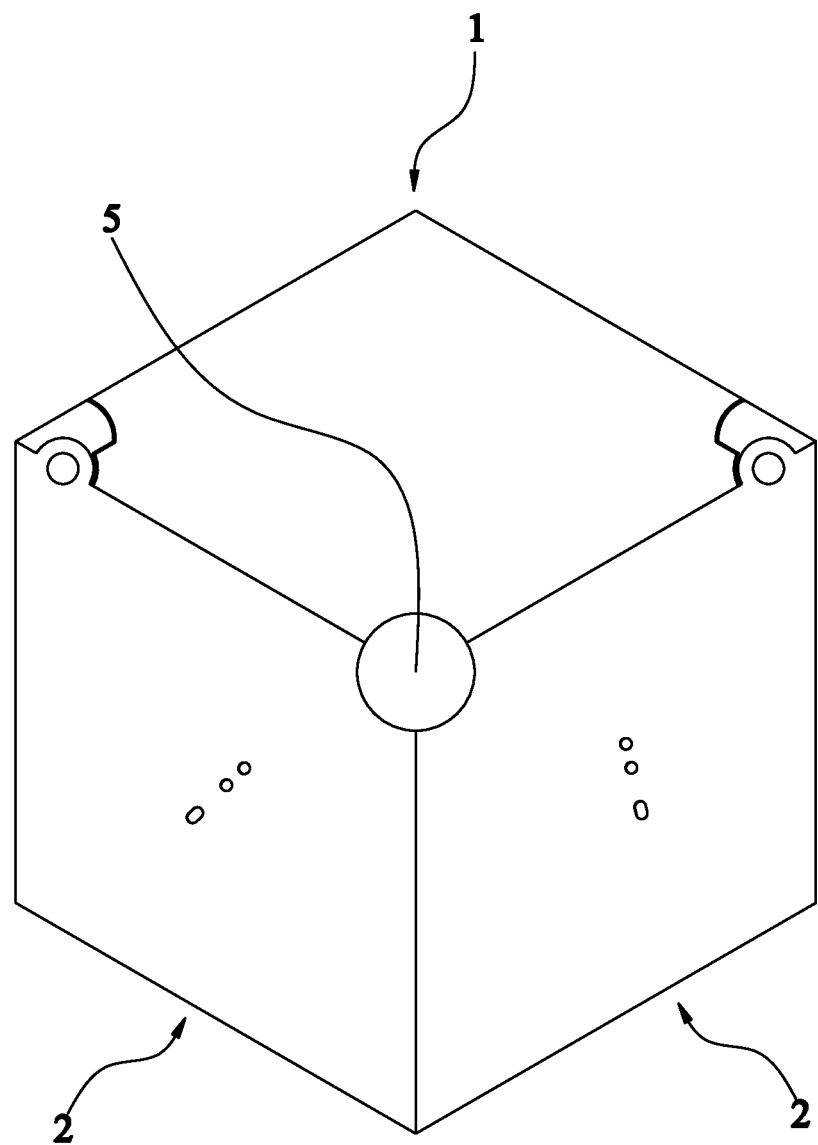
FIG. 14 illustrates another status of the example in FIG. 12.

Please refer to FIG. 12 to FIG. 14, a wiring box is provided. The wiring box is hexagon. And the same effect is capable of being achieved.

In this embodiment, the wiring box has three quadrangle portions. Namely, the center plate 1 and the lateral plate 2 are quadrangle such as diamond. Therefore, one center plate 1 and two lateral plate 2 are capable of forming a hexagonal wiring box. The wiring box is capable of being a regular hexagon.

Embodiment Five

A wire connecting box is provided. The wire connecting box has any of the wiring box mentioned above. The package volume of the wire connecting box is smaller, and the transportation cost is lower.

Embodiment Six

A lighting apparatus is provided. The lighting apparatus has a wire connecting box described in Embodiment Five. The package volume of the wire connecting box is smaller, and the transportation cost is lower. Therefore, the cost of package and transportation of the whole lighting apparatus is reduced.

While the present invention has been described by way of example and in terms of the preferred embodiments, it is to be understood that the present invention needs not be limited to the disclosed embodiments. For anyone skilled in the art, various modifications and improvements within the spirit of the present invention are covered under the scope of the present invention.

Embodiment Seven

Figure 15:
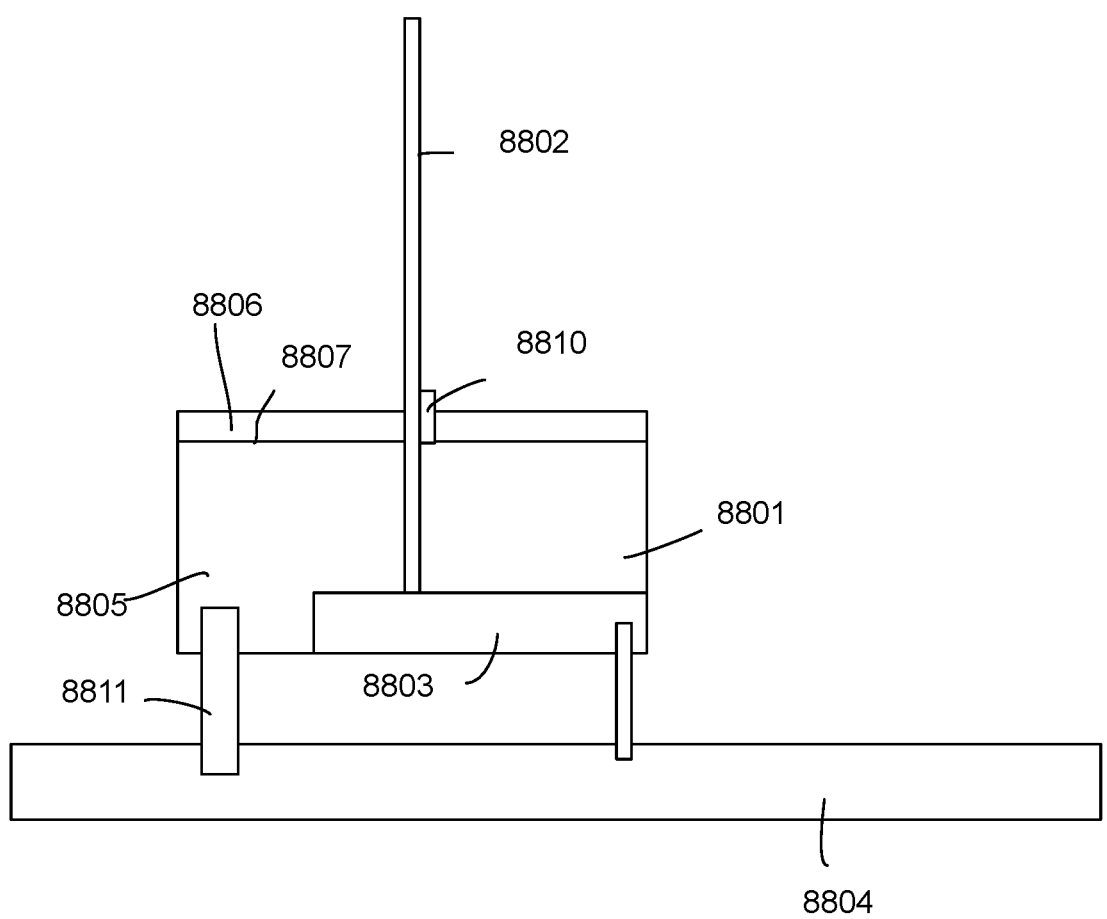
FIG. 15 shows a structure example of an embodiment.

In FIG. 15, a wiring box 8801 is used for connecting an external wire 8802 to a driver circuit and for connecting the driver circuit 8803 to a lighting apparatus 8804. The wiring box 8801 includes a box container 8805 and a foldable top cover 8806. In some embodiments, it is preferable that the lighting apparatus 8804 have elongated shapes, like light tubes.

The box container 8805 has a box opening 8807. The foldable top cover 8806 includes a center plate and at least one lateral plate. The center plate is connected to the at least one lateral plate with an axial structure, the lateral plate is folded to align with the center plate in an elongated manner during shipping. The lateral plate is rotated with respect to the center plate along the axial structure to expand and to cover the box opening of the box container. Detailed examples are explained in previous examples.

In some embodiments, when the center plate and the at least one lateral plate cover the box opening, the center plate and the at least one lateral plate form a wire opening for the external wire to pass through. Examples are also provided in previous embodiments.

In FIG. 15, the wire opening has a friction tap 8810 for fastening a connection to the external wire 8802 by adding friction to the connection to the external wire 8802.

In some embodiments, a first connector portion of the center plate is connected to a second connector portion of the lateral plate. The first connector portion and the second connection portion may be referenced to the reference numerals 21, 4, 13 in previous examples.

A first main portion of the center plate has a first main surface and the first connector portion of the center plate has a first connector surface, the first main surface is parallel to the first connector surface but on different planes, a second main portion of the lateral plate has a second main surface, the second main surface and the first main surface are on the same plane.

In some embodiments, there is a first stop structure on the center plate to limit rotation of the lateral plate rotating with respect to the center plate.

In some embodiments, the first stop structure clips the lateral plate to keep the lateral plate staying at a rotation position with respect to the center plate unless an external force is larger than a threshold to change the rotation position.

In some embodiments, the lighting apparatus is a light tube.

In some embodiments, there is only one lateral plate located at one end of the center plate, and the box opening is a circular shape.

In some embodiments, there are two lateral plates located at two opposite ends of the center plate, and the box opening is a circular shape.

In some embodiments, there are two lateral plates located at two opposite ends of the center plate, the two lateral plates are triangle shapes and has a half size of the center plate, the box opening is a rectangular shape.

In some embodiments, there are two lateral plates located at two opposite ends of the center plate, the center plate and the two lateral plates are rhombus shapes and the box opening is a hexagonal shape.

In some embodiments, the box container is foldable to be a flatten piece.

Figure 16:
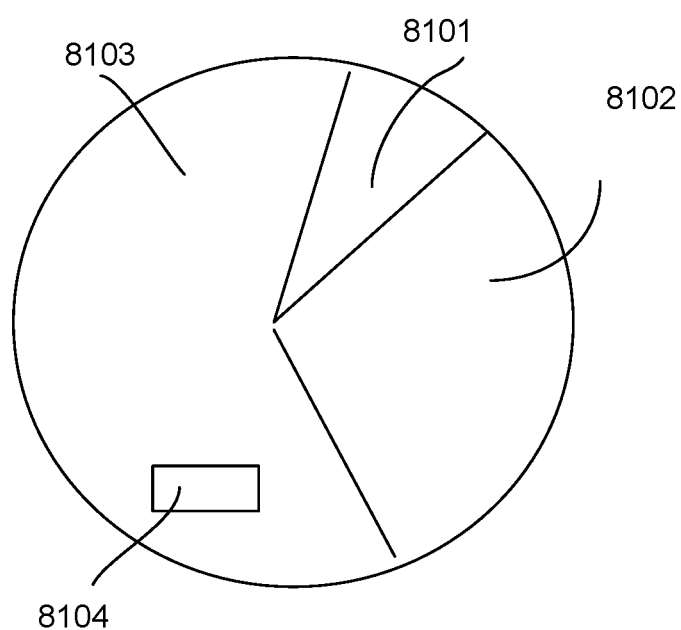
FIG. 16 shows a rotation angle being used for setting.

In FIG. 16, a rotation angle 8101 between the lateral plate 8102 and the center plate 8103 corresponds to a parameter for a driver to control the lighting apparatus.

In FIG. 16, a manual switch 8104 is disposed on the center plate 8103 for a user to operate the manual switch 8104 for changing a parameter of a driver to control the lighting apparatus.

Figure 17:
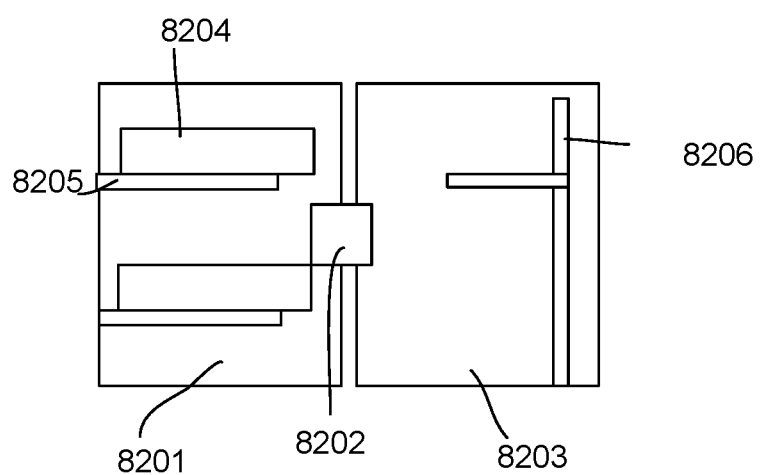
FIG. 17 shows multiple function modules being installed to a wiring box.

In FIG. 17, the box container 8201 has a connector 8202 for connecting to anther box container 8203 to another wiring box.

In FIG. 17, the container box has multiple tracks 8205 for installing multiple function modules 8204. For example, the function modules may be a wireless module, a speaker module, an IoT (Internet of Things) module, a sensor module or other components.

In FIG. 17, the container box has a conductive path 8206 for connecting the function modules installed in the tracks.

In some embodiments, the container box is made of metal material.

In FIG. 15, a heat dissipation strip 8811 is extended from the lighting apparatus 8804 to the container box 8801 for carrying away heat from the lighting apparatus 8804 to the container box 8801.

In some embodiments, the heat dissipation strip is electrically isolated from electrical connection of the lighting apparatus.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A wiring box used for connecting an external wire to a driver circuit and for connecting the driver circuit to a lighting apparatus, comprising:
   a box container with a box opening; and
   a foldable top cover comprising a center plate and at least one lateral plate, the center plate being connected to the at least one lateral plate with an axial structure, the lateral plate being folded to align with the center plate in an elongated manner during shipping, the lateral plate being rotated with respect to the center plate along the axial structure to expand and to cover the box opening of the box container, wherein when the center plate and the at least one lateral plate covers the box opening, the center plate and the at least one lateral plate form a wire opening for the external wire to pass through.

2. The wiring box of claim 1, wherein the wire opening has a friction tap for fastening a connection to the external wire by adding friction to the connection to the external wire.

3. The wiring box of claim 1, wherein a first connector portion of the center plate is connected to a second connector portion of the lateral plate, a first main portion of the center plate has a first main surface and the first connector portion of the center plate has a first connector surface, the first main surface is parallel to the first connector surface but on different planes, a second main portion of the lateral plate has a second main surface, the second main surface and the first main surface are on the same plane.

4. The wiring box of claim 3, wherein there is a first stop structure on the center plate to limit rotation of the lateral plate rotating with respect to the center plate.

5. The wiring box of claim 4, wherein the first stop structure clips the lateral plate to keep the lateral plate staying at a rotation position with respect to the center plate unless an external force is larger than a threshold to change the rotation position.

6. The wiring box of claim 1, wherein the lighting apparatus is a light tube.

7. The wiring box of claim 1, wherein there is only one lateral plate located at one end of the center plate, and the box opening is a circular shape.

8. The wiring box of claim 1, wherein there are two lateral plates located at two opposite ends of the center plate, and the box opening is a circular shape.

9. The wiring box of claim 1, wherein there are two lateral plates located at two opposite ends of the center plate, the two lateral plates are triangle shapes and has a half size of the center plate, the box opening is a rectangular shape.

10. The wiring box of claim 1, wherein there are two lateral plates located at two opposite ends of the center plate, the center plate and the two lateral plates are rhombus shapes and the box opening is a hexagonal shape.

11. The wiring box of claim 1, wherein the box container is foldable to be a flatten piece.

12. The wiring box of claim 1, wherein a rotation angle between the lateral plate and the center plate corresponds to a parameter for a driver to control the lighting apparatus.

13. The wiring box of claim 1, wherein a manual switch is disposed on the center plate for a user to operate the manual switch for changing a parameter of a driver to control the lighting apparatus.

14. The wiring box of claim 1, wherein the box container has a connector for connecting to anther box container of another wiring box.

15. The wiring box of claim 1, wherein the container box has multiple tracks for installing multiple function modules.

16. The wiring box of claim 15, wherein the container box has a conductive path for connecting the function modules installed in the tracks.

17. The wiring box of claim 1, wherein the container box is made of metal material.

18. The wiring box of claim 17, wherein a heat dissipation strip is extended from the lighting apparatus to the container box for carrying away heat from the lighting apparatus to the container box.

19. The wiring box of claim 17, wherein a heat dissipation strip is electrically isolated from electrical connection of the lighting apparatus.

* * * * *